United States Patent [19]

Namose

[11] Patent Number: 5,294,294

[45] Date of Patent: * Mar. 15, 1994

[54] METHOD OF DRY ETCHING IN SEMICONDUCTOR DEVICE PROCESSING

[75] Inventor: Isamu Namose, Suwa, Japan

[73] Assignee: Seiko Epson Corporation, Tokyo, Japan

[*] Notice: The portion of the term of this patent subsequent to Dec. 22, 2009 has been disclaimed.

[21] Appl. No.: 994,563

[22] Filed: Dec. 21, 1992

Related U.S. Application Data

[63] Continuation-in-part of Ser. No. 736,855, Jul. 29, 1991, Pat. No. 5,173,151.

[30] Foreign Application Priority Data

Jul. 30, 1990 [JP] Japan .................... 2-201811
Apr. 5, 1991 [JP] Japan .................... 3-72811

[51] Int. Cl.$^5$ .................... B44C 1/22; C03C 15/00; C03C 25/06
[52] U.S. Cl. .................... 156/643; 156/657; 437/238
[58] Field of Search ............... 156/643, 646, 650, 653, 156/657, 659.1, 662; 437/228, 238; 204/192.32, 192.37; 252/79.1

[56] References Cited

U.S. PATENT DOCUMENTS 5,173,151 12/1992 Namose .................... 156/643

Primary Examiner—William A. Powell
Attorney, Agent, or Firm—W. Douglas Carothers, Jr.

[57] ABSTRACT

A dry chemical etching method for etching one or more silicon oxide layers, such as SOG, TEOS, LTO or other types of deposited Si or $SiO_2$ layers, provides for low selectivity (ratio) with high controllability and reliability with shorter etching times and increased wafer throughput and yield with improved uniformity in planarization. The etching medium comprises $C_nF_{2n+2}$, wherein n is an integer, such as, $CF_4$, $C_2F_6$ or $C_3F_8$, and an inert gas, such as, He, Ar or Xe. The inert gas as properly mixed with the fluoride gas provides an adsorption layer at the etching surface providing a buffering effect on the fluorine radicals, F*, liberated in the plasma, so that control over the uniformity and the rate of etching can more easily be accomplished without fear of nonuniform etching or over-etching.

19 Claims, 13 Drawing Sheets

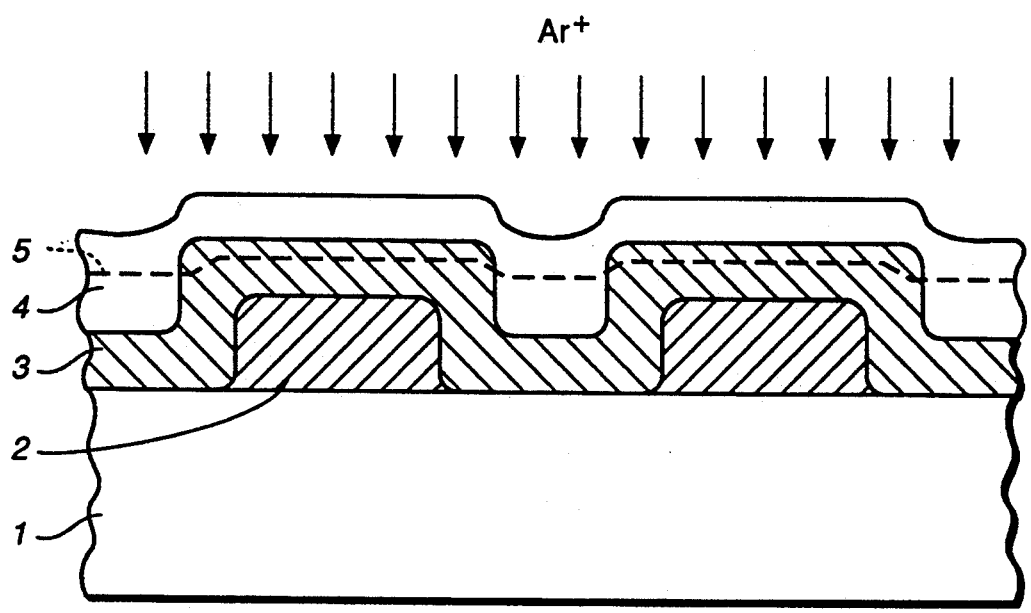
FIG._1
(PRIOR ART)
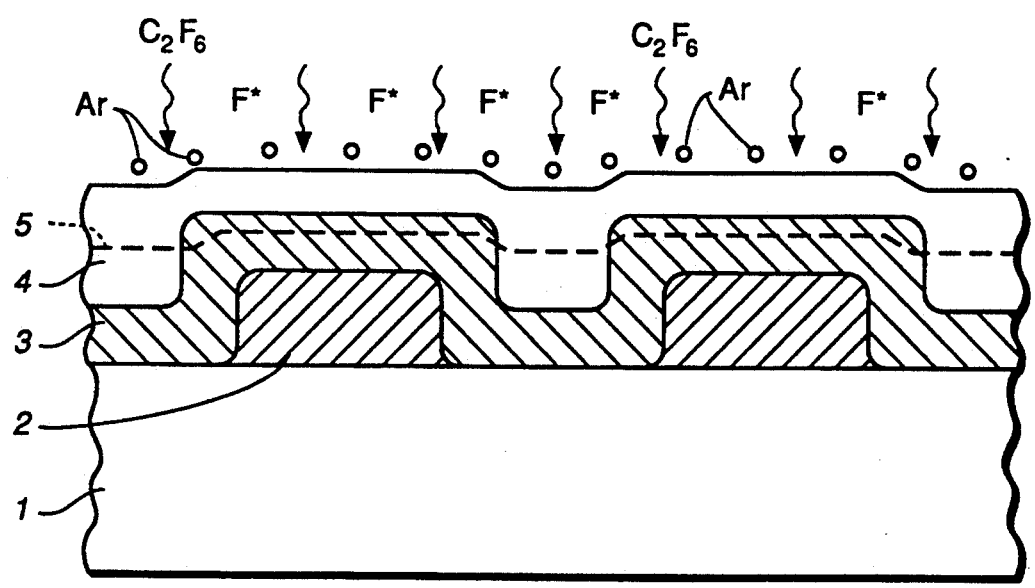
FIG._2

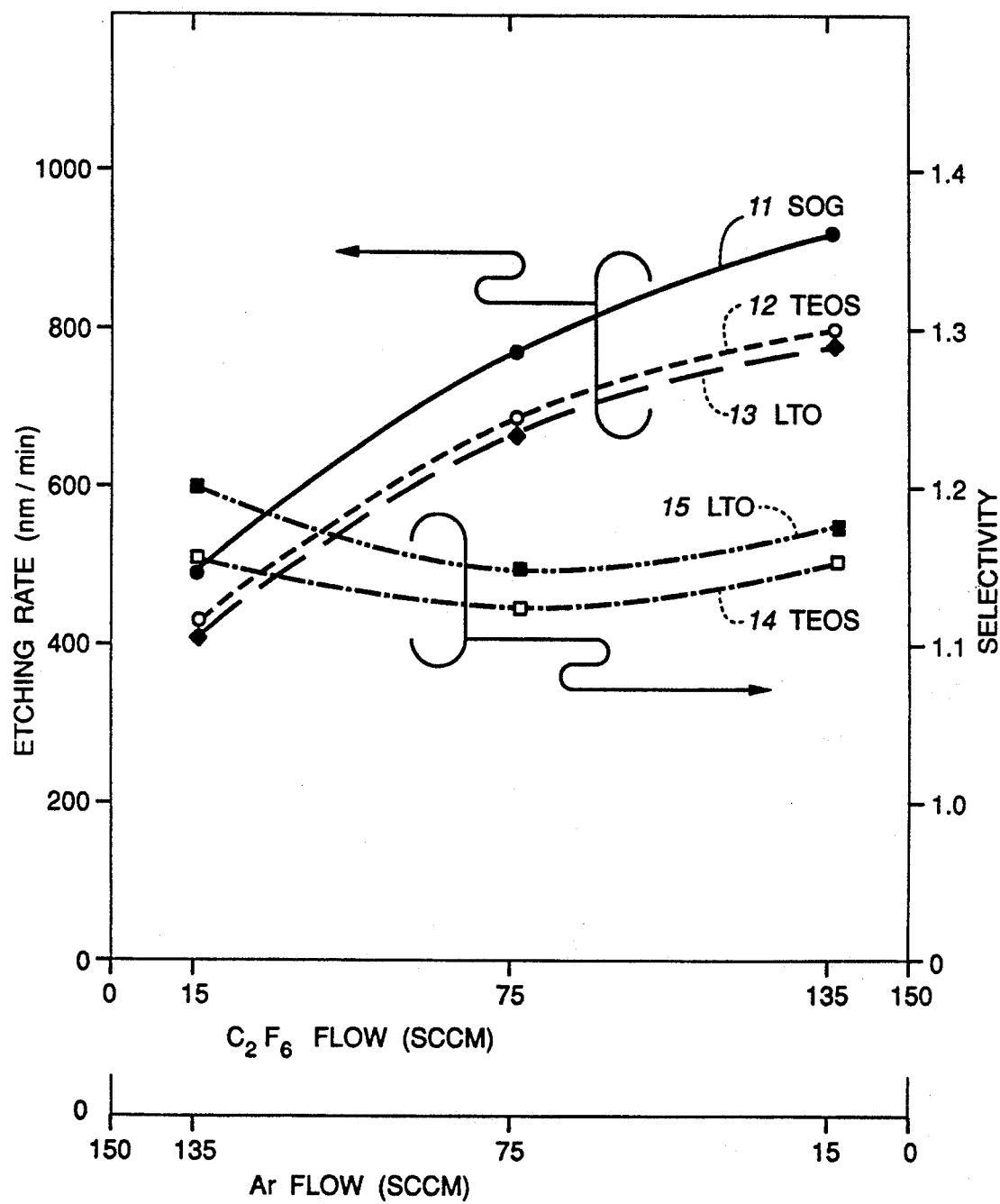
FIG._4

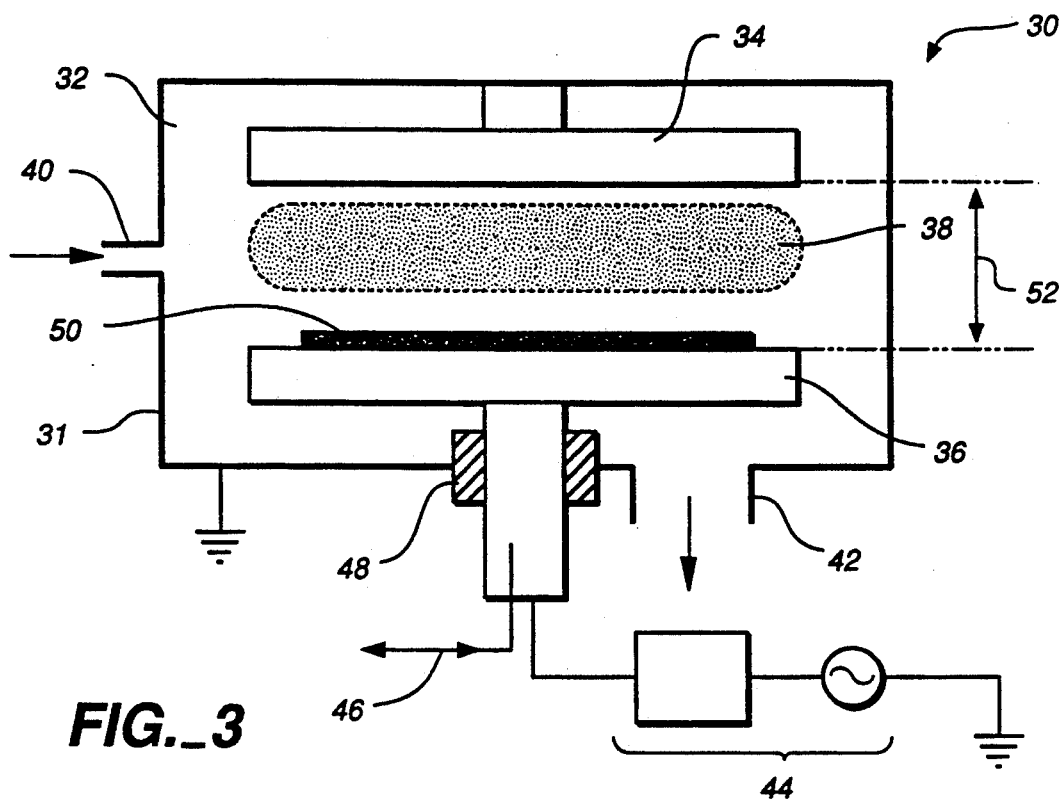
FIG._3
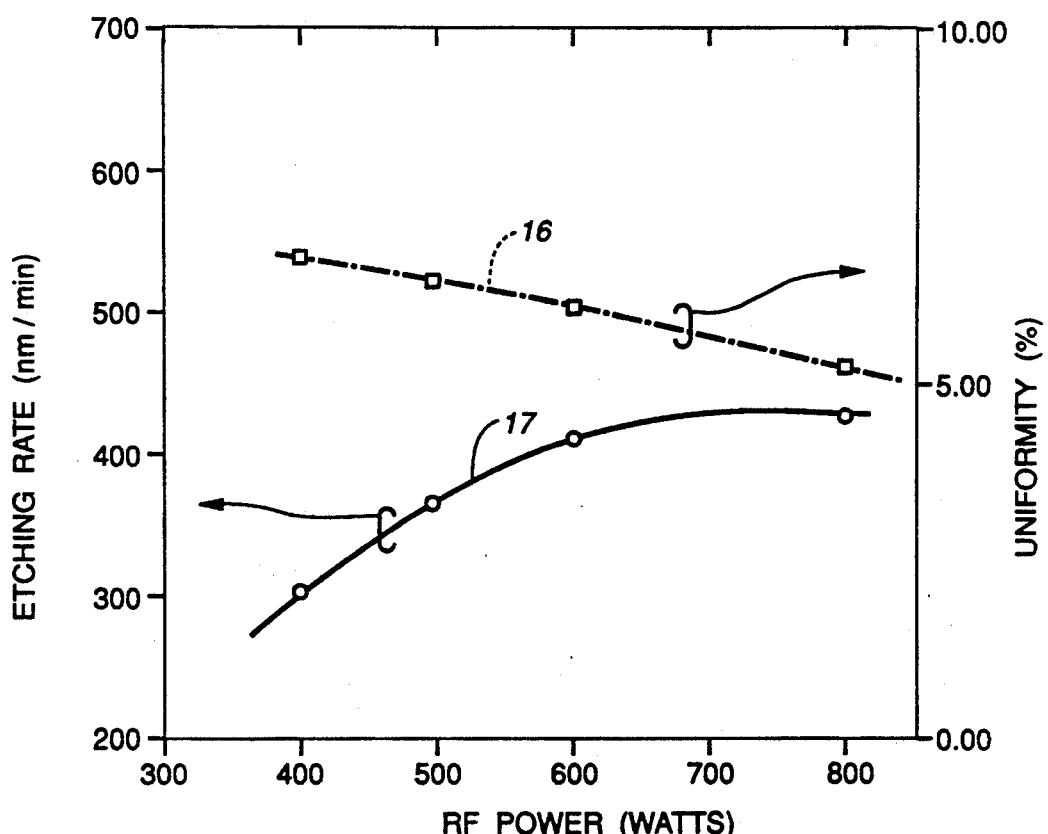
FIG._5

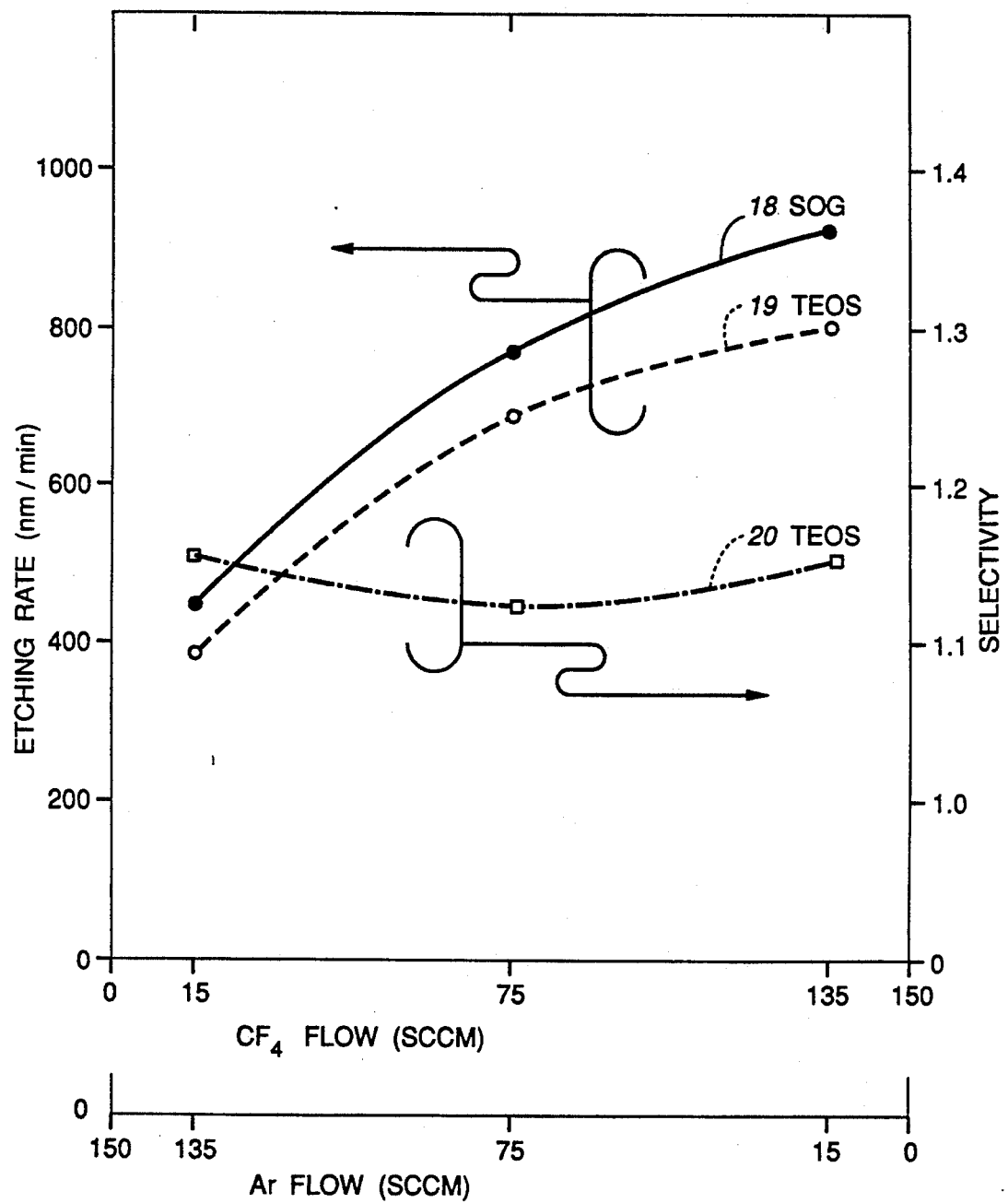
FIG._6

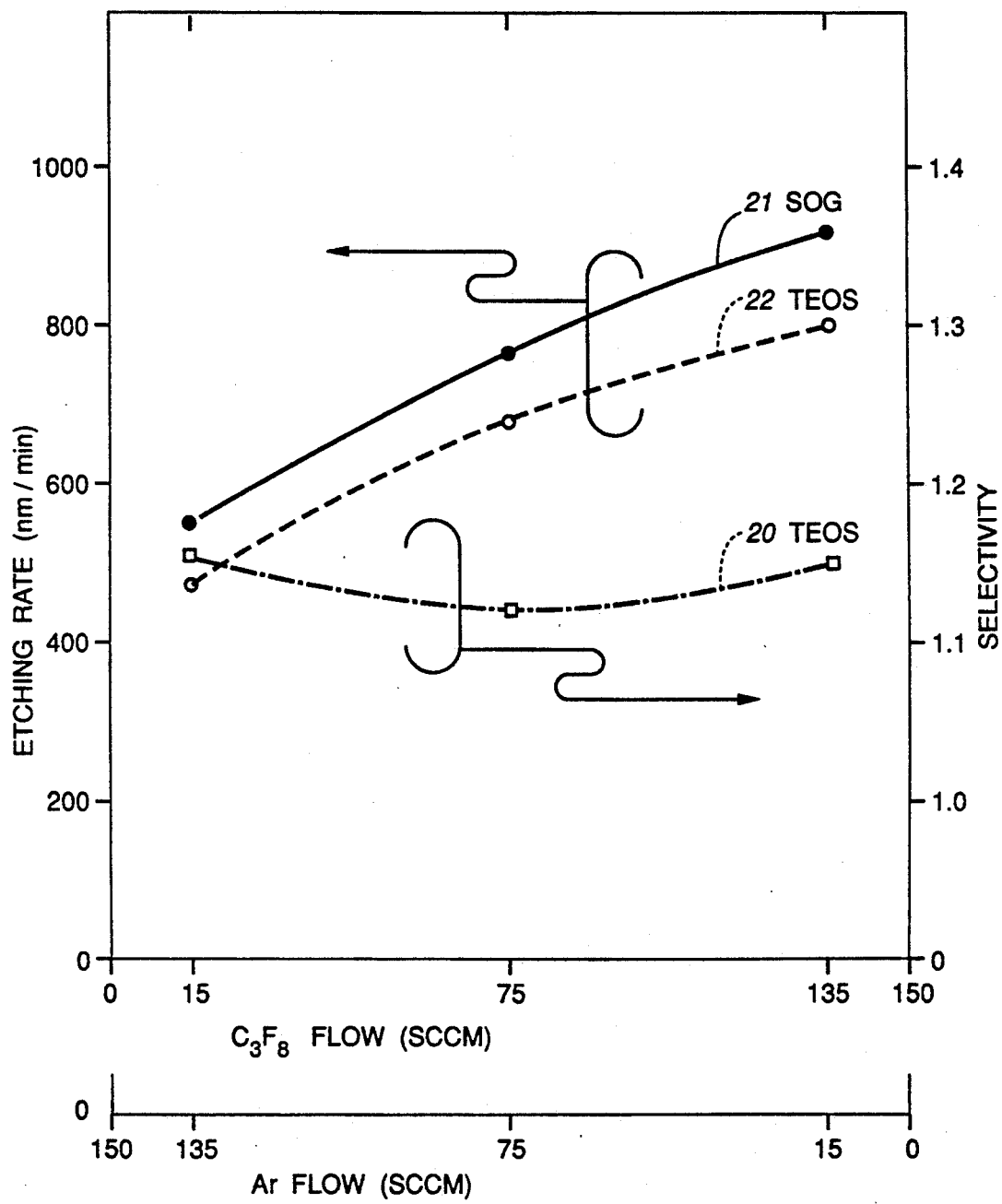
FIG._7

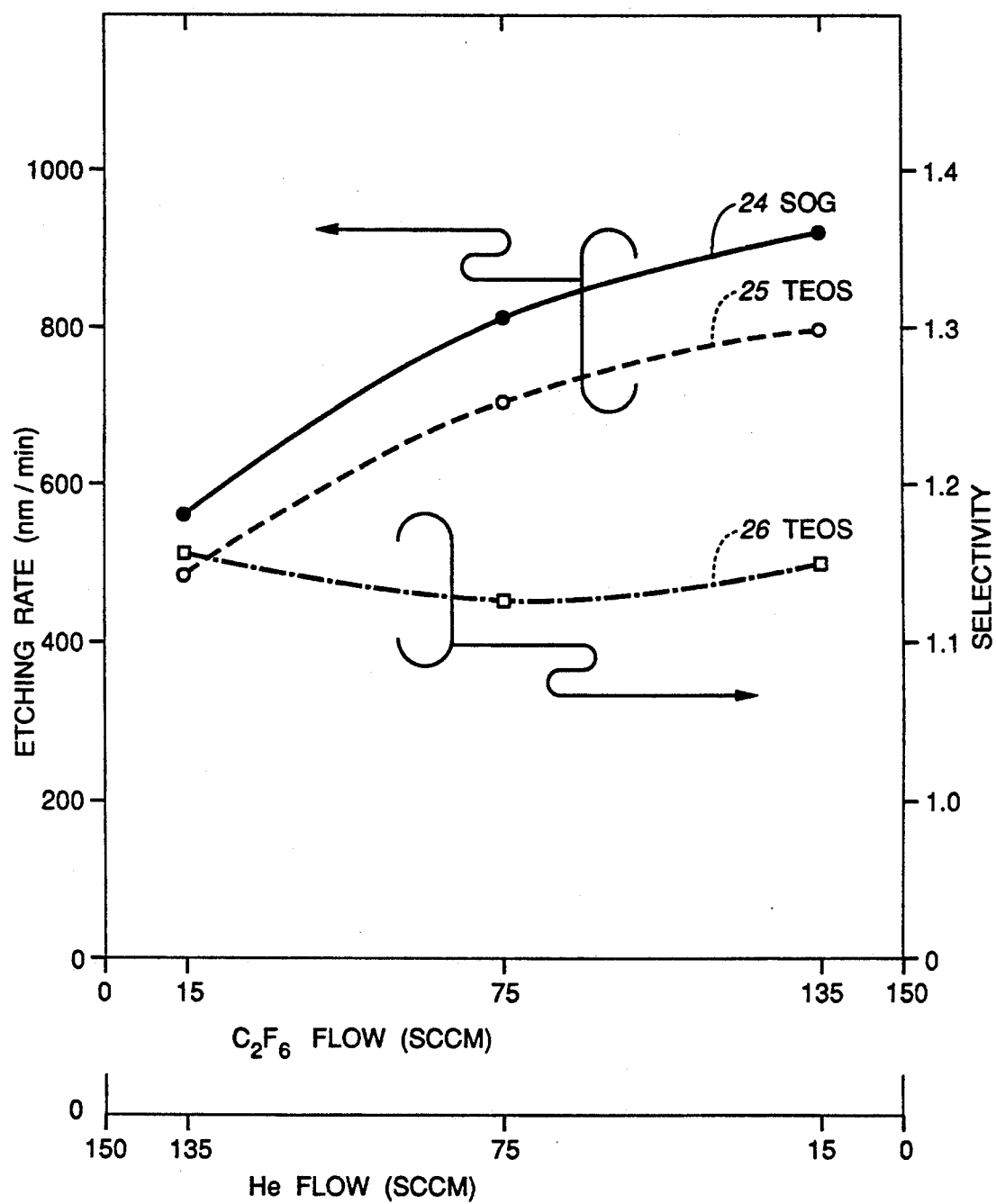
FIG._8

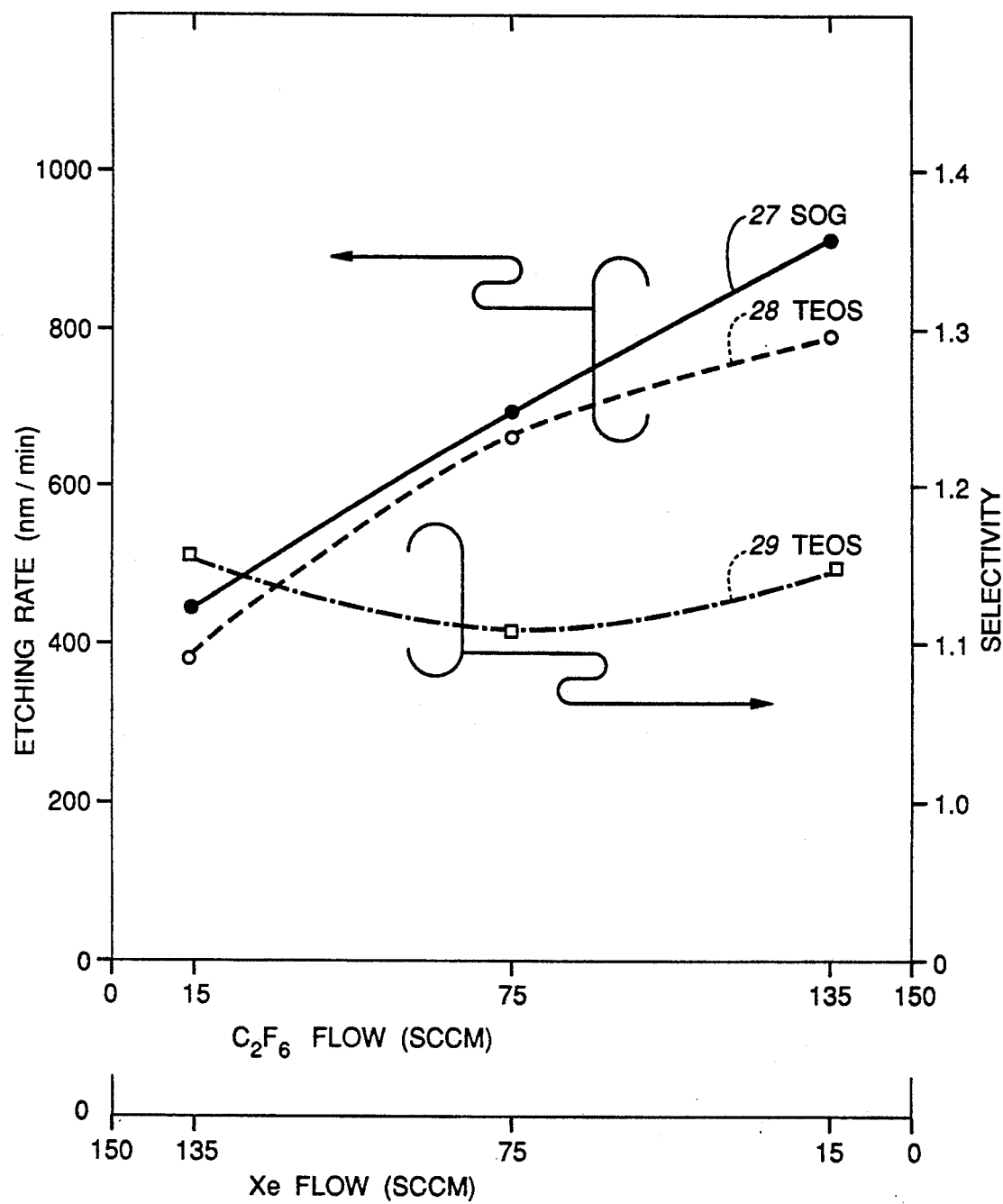
FIG._9

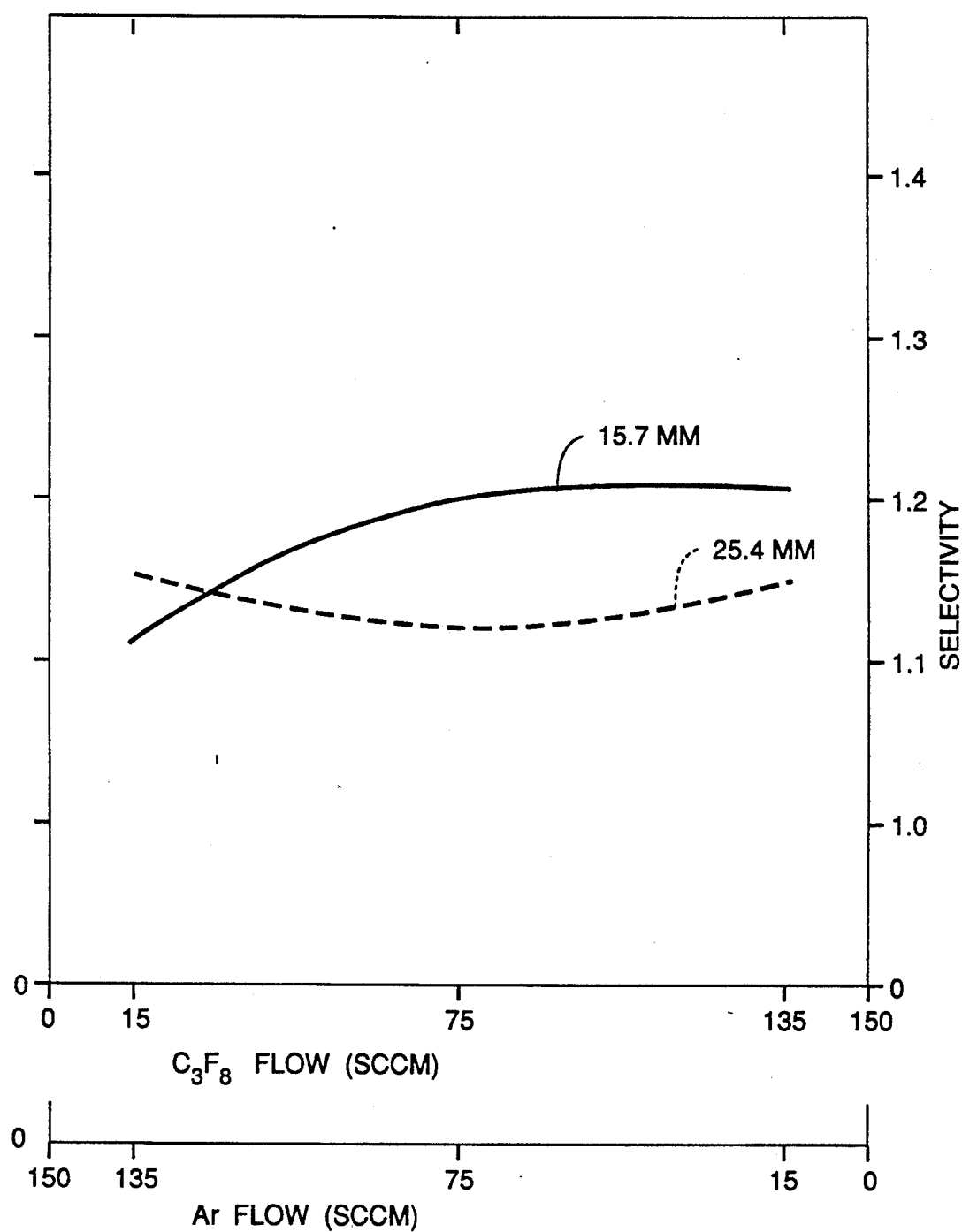
FIG._10

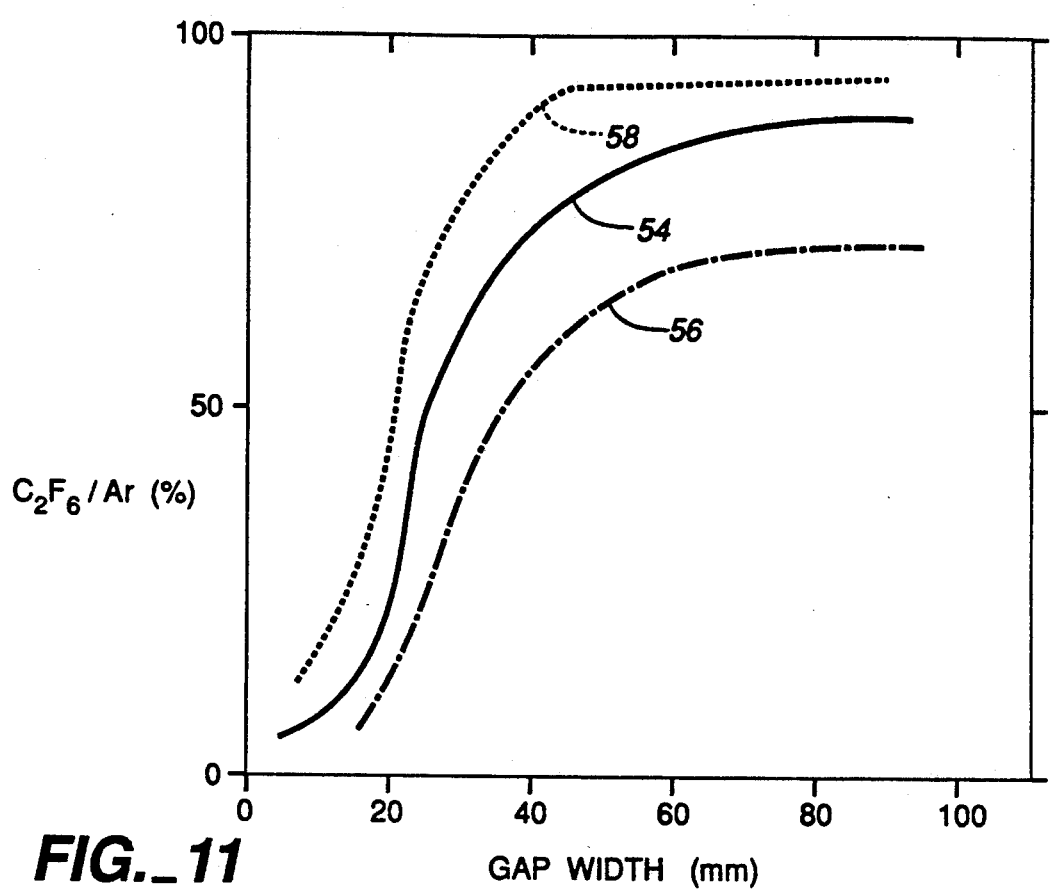
FIG._11
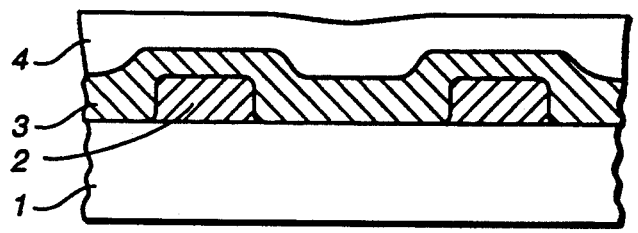
FIG._12A
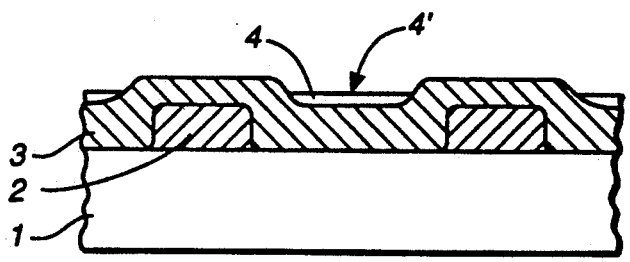
FIG._12B

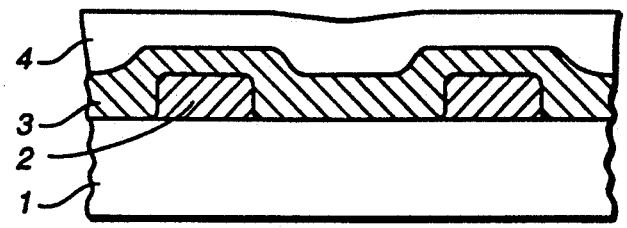
FIG._12C
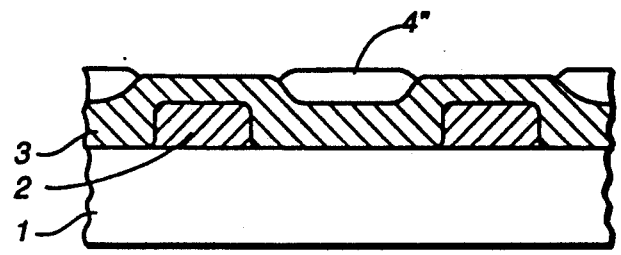
FIG._12D
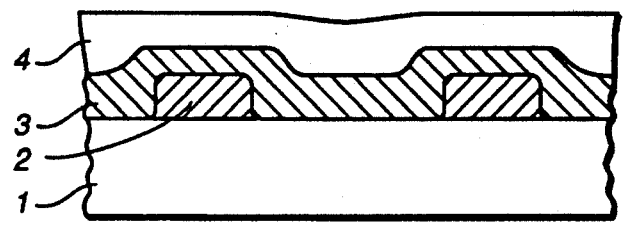
FIG._13A
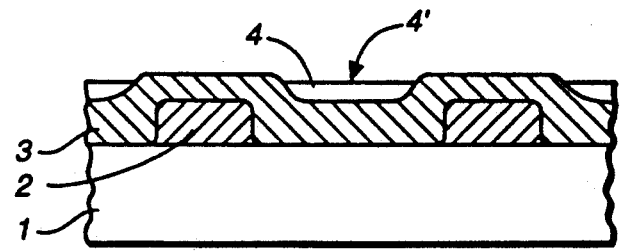
FIG._13B
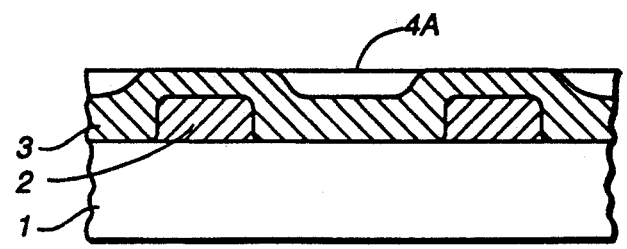
FIG._13C

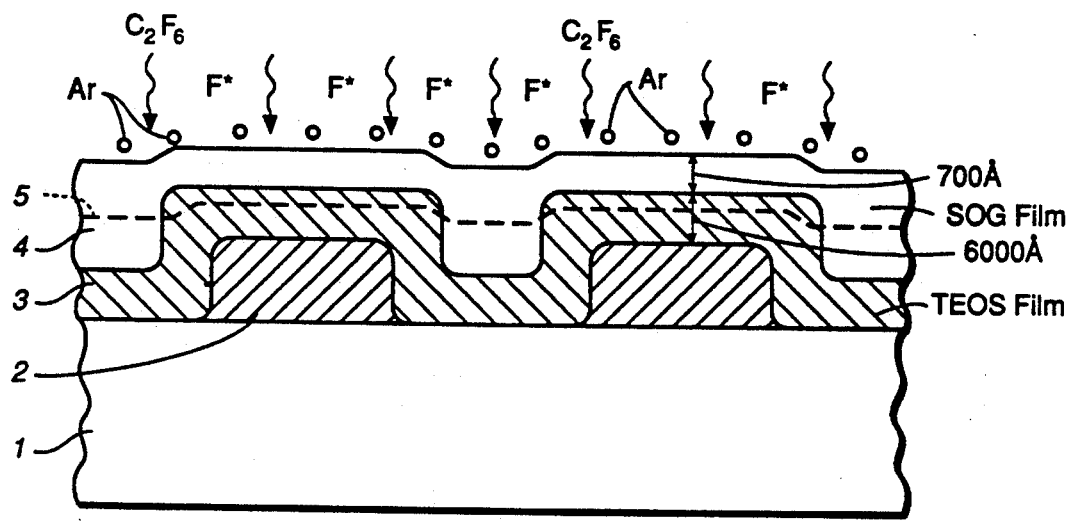
FIG._14
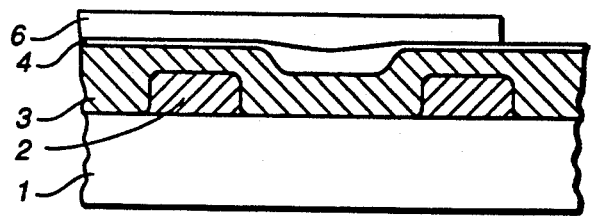
FIG._16A
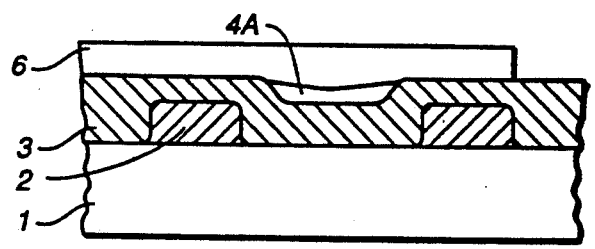
FIG._16B

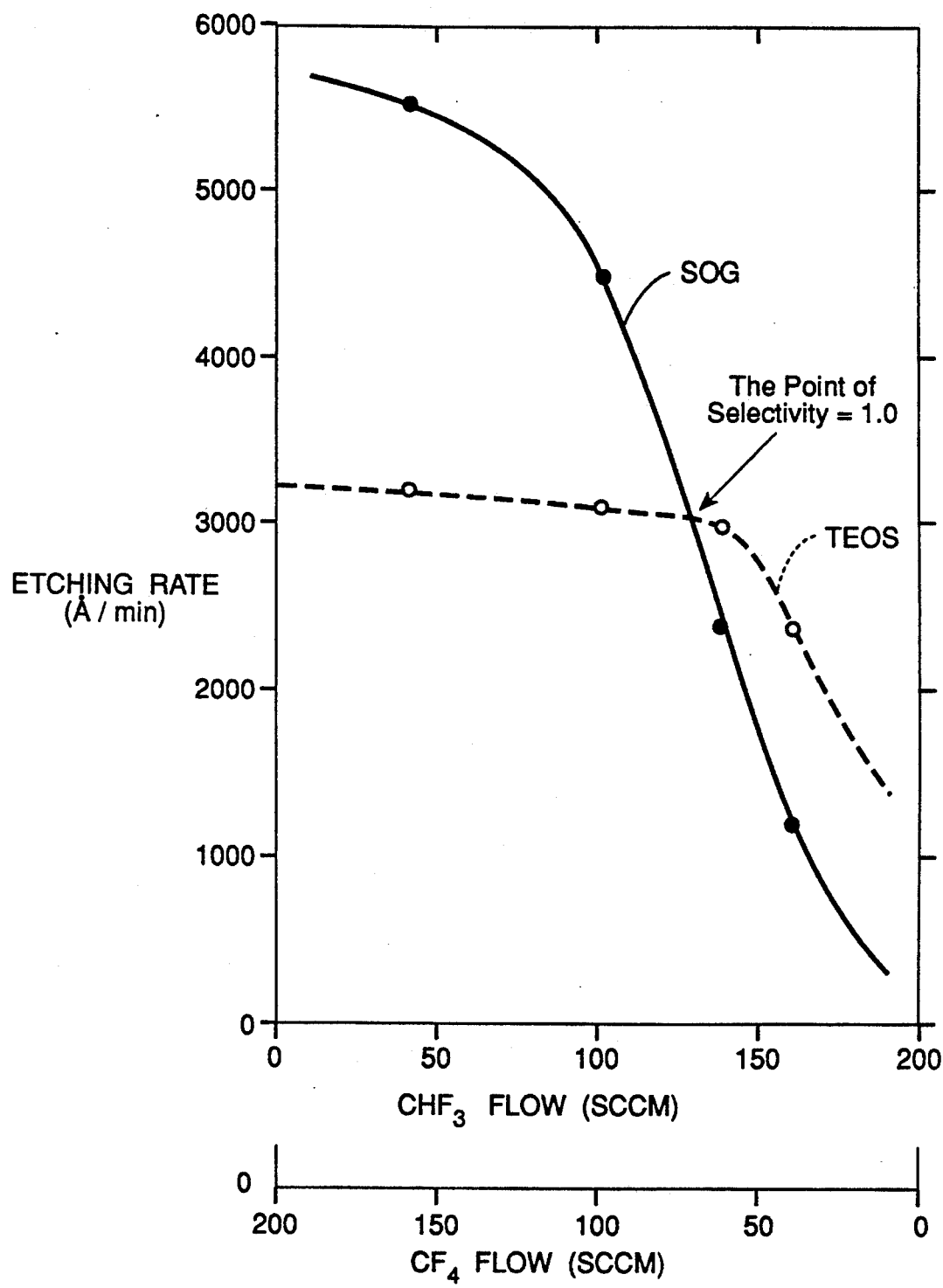
FIG._15

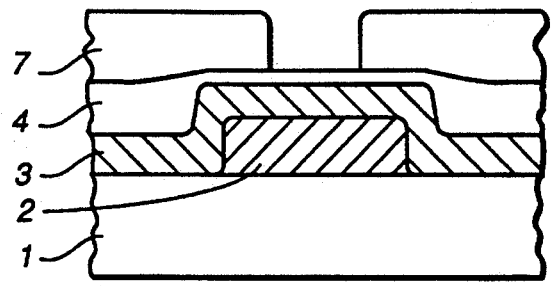
FIG._17A
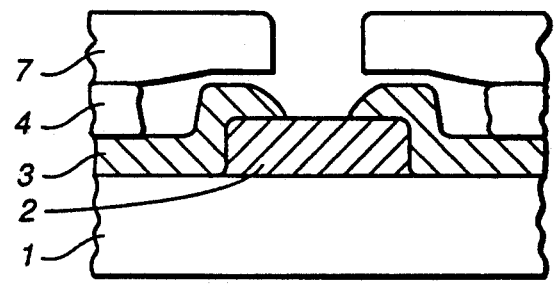
FIG._17B
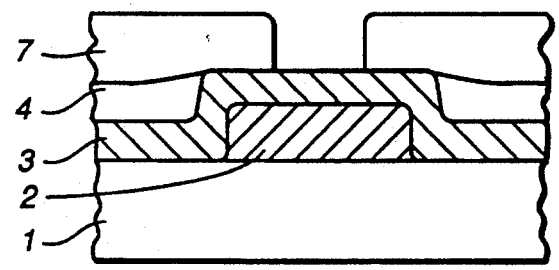
FIG._18A
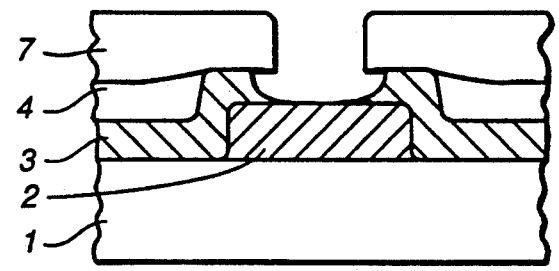
FIG._18B

METHOD OF DRY ETCHING IN SEMICONDUCTOR DEVICE PROCESSING

CROSS-REFERENCE TO RELATED APPLICATION

This application is a continuation-in-part of patent application, Ser. No. 07/736,855, filed Jul. 29, 1991, now U.S. Pat. No. 5,173,151, issued Dec. 22, 1992.

BACKGROUND OF THE INVENTION

1. Field of the Invention

This invention relates to a method of dry etching in semiconductor processing and more particularly to an etch-back method of different silicon oxide layers to achieve topographical planarization.

2. Description of Related Art

The achievement of topographical planarization is important in forming semiconductor wafers that have two or more metal layers. In the usual case, a semiconductor structure is produced comprising layers of oxide, polysilicon, and first metal wiring, or conductors, covered with an intermediate insulator layer. The surface of this latter layer is irregular with sharp edges and cracks. To apply a second layer of metal such as aluminum, on its surface is not practical because it will result in cracks or separations in the metal, or incomplete metal coverage, so that device yield would be significantly reduced. Thus, it is necessary to provide a method for planarizing the insulator layer to provide a smoother surface topography for application of a second or subsequent metal layer.

FIG. 1 illustrates a conventional method for providing topographical planarization of silicon oxide layers, in particular, intermediate insulator layers, which is in common practice. As shown in FIG. 1, metal wiring or conductors 2, e.g., Al, are formed by vapor deposition of a metal layer on substrate 1 followed by selective etching of the metal layer to form conductors 2. Then, oxide layer 3, i.e., $SiO_2$ layer, is formed by CVD followed by formation through thermal oxidation of SOG layer 4 which fills the gaps and indentations formed by first oxide layer 3 over conductors 2. As illustrated in FIG. 1, the surface of SOG layer 4 is irregular. The present practice is to subject the combination layers 3 and 4 to a dry or plasma etch-back process by sputtering or ion milling to reduce the thickness of these layers to the level indicated by dotted line 5, so that an enhanced planarized surface and contour is achieved. The process employed is a physical etching procedure wherein ion milling of the insulator film surfaces is accomplished in a reactive ion etching system employing an inert gas, such as, Ar. The selectivity of the second silicon oxide layer 4 (SOG) with respect to the first silicon layer 3 ($SiO_2$) is about 1.18. The etch-back process chosen should be selected to closely match as best as possible the etch rate for SOG layer 4 and $SiO_2$ layer 3. Ideally, such a selectivity ratio should be 1.0:1.0 but this is, in practice, not generally possible. In any case, a selectivity ratio in the range of 0.8–1.7:1.0 is acceptable. Further, the thicker SOG layer 4 is, the more planarized is the surface that can be achieved, but accompanied with a correspondingly longer period of time required for the etch-back process.

The employment of ion milling methods utilizing heavy inert Ar ions to impact the surface of layers 3,4, physically remove molecular materials from the surface. The etching rates achieved are relatively low, for example, several tens of nanometers per minute so that the etch-back process can be comparatively quite long. This process can be so long in the case of a thick SOG layer 4, that it becomes impractical.

Further, the employment of ion milling or other such physical etching method results in damage to the semiconductor structure due to the physical ion bombardment. The resulting effect is an increase in threshold voltages for subsequently formed transistors.

Also, the $SiO_2$ molecules removed from the surface adhere to the plasma system electrode, resulting in the re-adherence of $SiO_2$ particles on the surface being etched, and in lower device yield. This particular problem becomes more pronounced as SOG layer 4 is deposited with increasing thickness.

It is also known to use a plasma etch comprising fluorocarbon gases wherein a primary etching gas, such as, $C_2F_6$, is employed in combination with a secondary gas, such as, $CHF_3$ or $O_2$, to control the selectivity of the etch. Such a system provides for a chemical etching rather than a physical etching to etch-back silicon oxide. Also, an inert gas may be employed as a carrier gas. These plasmas contain active fluorine species and the addition of $O_2$ enhances the effectiveness of the plasma because $O_2$ helps to inhibit the recombination between fluoride radicals, $F^*$, and thereby increases and extends their concentration. The inert gas, such as, helium or argon, employed in these etching environments as a carrier gas helps to control the temperature during the etching process. See, for example U.S. Pat. No. 4,676,867. However, the continuing problem with these fluorocarbon etching systems is the lack of repeatable control over the rate and uniformity of etching. It is very difficult to etch different types of $SiO_2$ films, e.g., TEOS, by means of chemical etching. In particular, such chemical etching of a SOG layer is generally about 3 to 5 times higher than a thermal oxide layer. However, in the manufacturing step utilizing the etch-back of a combination of these oxide layers, it is necessary that the etching rate of both such layers be approximately the same, i.e., as close as possible to a selectivity ratio of 1.0/1.0.

Thus, what is needed is a better means of controlling the rate of chemical etching when employing a fluorocarbon reactive ion etching system wherein the rate of etching can be controlled in a practical, repeatable manner achieving optimized selectivity.

Thus, it is an object of this invention to provide a method of dry etching having a high etching rate with a relatively low selectivity ratio providing for a reduced etching time with high reliability and repeatability to provide a corresponding improved yield rate in the production of semiconductor devices.

It is another object of this invention to provide a method of applying an absorption layer to an etching surface to provide a buffering effect to highly active etching medium.

It is another object of this invention to provide an etching system having a predetermined gap width between spatially parallel electrodes of the etching system to provide for optimum etching uniformity.

It is another object of this invention to provide a method of uniform planarization relative to first and second oxide layers deposited on a semiconductor wafer through the use of a dry etching medium comprising first and second etchback steps wherein one step has a selectivity greater than one and the other step has a selectivity less than one.

SUMMARY OF THE INVENTION

According to this invention, a dry chemical etching medium for use in a reactive ion etching system for dry etching silicon oxide, such as, SOG, TEOS or LTO layers, comprises a gas mixture of a carbon fluoride gas, represented by a general formula $C_nF_{2n+2}$, wherein n is an integer, such as, $CF_4$, $C_2F_6$ or $C_3F_8$, and an inert gas, such as, He, Ar or Xe. In particular, the method of this invention places high reliance on the development and use of fluorine radicals, F*, in the plasma which are thoroughly mixed with an inert gas, e.g., He, Ar or Xe. I have discovered that the inert gas as properly mixed with the fluoride gas forms an absorption layer functioning as a molecular cushion at the etching surface which buffers the application of fluorine radicals, F*, liberated in the plasma and applied to the etching surface, so that control over the uniformity and rate of etching can more easily be accomplished without fear of nonuniform etching or over-etching. Furthermore, enhancement of etching uniformity can be achieved by taking into consideration the gap width utilized between the anode electrode and the cathode electrode in the reactive ion etching system employed in the practice of this invention.

The application of this invention has particular application for etch-back of first and second silicon oxide layers, such as, a TEOS or LTO layer and a SOG layer. In the preferred form of the method, four parameters are considered wherein RF power may be in the range of 400 W-800 W, gas flow rate is within the range of 1:100-30:1, total gas flow is within the range of 100 sccm-250 sccm and the pressure of the system is 200 mTorr-300 mTorr.

Since the etching rate of the chemical etching method of this invention is more than ten times greater than that of the physical etching method in conventional sputter etching or ion milling, the applied etching process may be accomplished in a shorter period of time. In addition, a low selectivity ratio substantially the same as that achieved in conventional etching methods is realizable with respect to differently deposited silicon oxide layers. Thus, by application of the method of dry etching of this invention to the process of planarization of silicon oxide layers, a shorter time for a required etch-back process can be achieved. Thus, in cases where it is desirable to provide a second silicon oxide layer to be applied over a first silicon oxide layer wherein the former layer is provided with a much larger thickness than the latter to improve the level of planarization, it is possible with the method of this invention to achieve completion of the etch-back in shorter period of time or in a time period not greater than in the case where the second layer is thinner and conventional sputter etching or ion milling is utilized for etch-back.

Furthermore, since a chemical etching process is being utilized, problems encountered in physical etching processes such as transistor thresholds, can be avoided. Since the product of chemical etching reaction is volatile, re-adherence of etched silicon particles to the wafer surface does not occur so that an improvement in device yield can be achieved.

In another aspect of this invention, uniform planarization is achieved in the employment of two different etchback steps utilized in etching two consecutively deposited oxide layers, e.g., a SOG layer and a TEOS layer, having different rates of etching. In other words, the second deposited oxide layer may have a selectivity greater than one while the first deposited layer may have a selectivity less than 1. First, the second deposited oxide layer is etched back until substantial exposure of the first deposited oxide layer is achieved. Second, the first deposited oxide layer is etched back until the surfaces of said second oxide layer and remaining portion of said first oxide layer are substantially co-planar.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a cross-sectional view of a wafer having first and second oxide layers relative to the conventional application of the method of achieving planarization as conventionally utilized.

FIG. 2 is a cross-sectional view of a wafer having first and second oxide layers and utilized in connection with the explanation of one embodiment of the method of this invention to achieve planarization.

FIG. 3 is a schematic representation of a reactive ion etching system that may be employed in the practice of this invention.

FIG. 4 is a graphic diagram illustrating the relationship between etching rate and selectivity ratio when varying the mixing ratio of hexafluoroethane gas ($C_2F_6$) and Ar gas in a reactive ion etching according to a first example of the method of this invention to the wafer shown in FIG. 2.

FIG. 5 is a graphic diagram illustrating etching rate and etching uniformity versus changes in RF power with respect to a thermal oxidation layer $SiO_2$.

FIG. 6 is a graphic diagram illustrating the relationship between etching rate and selectivity ratio when varying the mixing ratio of tetrafluoromethane gas ($CF_4$) and Ar gas in a reactive ion etching according to a second example of the method of this invention to the wafer example shown in FIG. 2.

FIG. 7 is a graphic diagram illustrating the relationship between etching rate and selectivity ratio when varying the mixing ratio of octafluoropropane gaa ($C_3F_8$) and Ar gas in a reactive ion etching according to a third example of the method of this invention to the wafer example shown in FIG. 2.

FIG. 8 is a graphic diagram illustrating the relationship between etching rate and selectivity ratio when varying the mixing ratio of hexafluoroethane gas ($C_2F_6$) and He gas in a reactive ion etching according to a fourth example of the method of this invention to the wafer shown in FIG. 2.

FIG. 9 is a graphic diagram illustrating the relationship between etching rate and selectivity ratio when varying the mixing ratio of hexafluoroethane gas ($C_2F_6$) and Xe gas in a reactive ion etching according to a fifth example of the method of this invention to the wafer shown in FIG. 2.

FIG. 10 is a graphic illustration of the relationship between the selectivity ratio and the gas flow ratio when the electrode gap width, relative to the system shown in FIG. 3, is 15.7 mm and 25.4 mm, respectively.

FIG. 11 is a graphic illustration of the relationship between the range of optimum gas flow ratio and electrode gap width relative to the system shown in FIG. 3.

FIGS. 12A and 12B illustrate the application of the method of this invention to a SOG and SiO2 (TEOS or LTO) film sample when the selectivity is greater than one.

FIGS. 12C and 12D illustrate the application of the method of this invention to a SOG and SiO2 (TEOS or LTO) film sample when the selectivity is less than one.

FIGS. 13A-13C illustrate the application of both methods illustrated in FIGS. 12A-12D producing an enhanced uniformly planarized surface.

FIG. 14 is a cross-sectional view of a wafer having first and second oxide layers having different selectivities and utilized in connection with the explanation of another embodiment (FIGS. 12A-12C) of the method of this invention to achieve planarization.

FIG. 15 is a graphic illustration of the relationship between the etching rate and the gas mixture flow of CHF3/CF4 relative to the respective etching of a SOG film and a TEOS film.

FIGS. 16A and 16B show a SOG/TEOS film sample and respectively illustrate the consequence when etchback of the SOG film is terminated prior to the exposure of the TEOS film and the advantage when etchback of the SOG film is performed until exposure of a substantial portion of the TEOS film.

FIGS. 17A and 17B show a SOG/TEOS film sample and illustrate the consequence when etchback of the SOG film is terminated prior to the exposure of the TEOS film in the case of forming a contact hole to underlying metal wiring.

FIGS. 18A and 18B show a SOG/TEOS film sample and illustrate the advantage when etchback of the SOG film is performed until exposure of a substantial portion of the TEOS film in the case of forming a contact hole to underlying metal wiring.

DETAILED DESCRIPTION OF THE INVENTION

FIG. 2 illustrates a typical semiconductor wafer in processing comprising the first metal layer and first and second oxide layers. A pattern of aluminum wiring or conductors 2 are formed in a conventional manner, e.g., vapor deposition and selective etching, on the surface of silicon substrate 1. This is followed by the deposition of SiO2 layer 3, comprising a first silicon oxide layer, which may be formed by CVD method or thermal oxidation over aluminum wiring 2, e.g., an LTO (Low temperature Thermal Oxidation) or TEOS (Tetra-Ethoxy-Ortho-Silicate) film. Next, SOG (Spin-On Glass) layer 4 is applied via a conventional spinner, comprising a second silicon oxide layer, onto SiO2 layer 3. As illustrated in FIG. 2, the resultant surface has an irregularity caused by the formation of Al wiring 2. In order to achieve a more uniformly planar surface, layers 3 and 4 are etched back to a level indicated by dotted line 5 using system 30 shown in FIG. 3. The etch-back method according to this invention is a chemical etching comprising a gas mixture comprising a carbon fluoride gas ($C_nF_{2n+2}$) and an inert gas, e.g., He, Ar or Xe.

Since a carbon fluoride gas ($C_nF_{2n+2}$) is employed, fluorine radicals, F*, are generated in the plasma so that etching proceeds by the following reaction with respect to first and second silicon oxide layers 3 and 4:

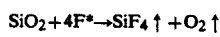

Even though a chemical etching process is involved, a high etching rate is achieved, but a low selectivity value close to 1 is achieved as the ratio of etching rate (selectivity) for different types of silicon oxide layers. As a result, faster, controlled etching rates can be realized without over-etching or irregular etching results. This is primarily due to the predetermined amount of an inert gas with the selected carbon fluoride gas.

Although the exact mechanism that brings about this uniformity and ease of controllability over the etching process is not readily understood, inert gas atoms in the plasma adhere to the etching surface bring about a controlled rate of chemical etching at the etching surface. These inert gas atoms form an absorption layer on the etching surface. The fluorine radicals, F*, are buffered by the Ar atomic absorption layer at the etching surface of the oxide layer or layers thereby functioning as "shock absorbers" or as a molecular cushion against the direct and somewhat erratic action of the highly active fluorine radicals engaging the silicon oxide etching surface. In other words, an absorption layer is formed by absorption of inert gas on the surface to be etched suppressing the chemical etching action of the fluorine radicals and, as a result, the selectivity for the different types of oxide layers may be made closer to 1. In the particular case here, that selectivity relative to SOG/silicon oxide layers is 1:1.12-1.16. As a result, it is possible to prevent degradation in the quality of devices formed on a semiconductor wafer due to structural damage caused by the etching process since the etching process of this invention provides no physical damage to the quality of oxide layers 3 and 4. Moreover, since the etching reaction produces a volatile compound, $SiO_4$, there are no Si or $SiO_2$ particles dislodged from the etching surface that have to be to contended with, i.e., that have to be removed from the system chamber or redeposit on the etching system surface. Thus, the etched surface remains at all times clear of etched solid silicon or silicon oxide particles resulting in a clean silicon oxide layer thereby improving yields of IC devices formed from the processed semiconductor wafer.

Known prior art techniques for etching use, in addition to a carbon fluoride gas and inert gas, another gas, e.g., $O_2$, to function in controlling selecctivity or the etch rate ratio. However, the utilization of such a constituent interferes with the establishment and maintenance of a good absorption layer by the inert gas component so that such a component is not necessary or utilized in this invention.

Also, in connection with the etching of SOG film 4, over-etching is limited to within the range of 0% to 20% of the thickness of the film, and more preferably within the range of 5% to 15% of the thickness of the film. This prevents the undesirable extended etching of the remaining portions of the SOG film 4 present on the underlying oxide film 3.

For the particular etch-back application suggested herein, etching is generally carried out over a predetermined time depending upon the etching rate determined by such parameters, such as, the gas mixing ratio, the chosen selectivity, and RF power. However, in applications of the etching method of this invention, other methods known in the art relating to end point detection may be utilized.

Reference is now made to FIG. 3 illustrating a reactive ion etching system that may be employed in the practice of the embodiments of this invention. System 30 comprises a housing 31 providing parallel, planar electrode type etching chamber 32 having an anode electrode 34 and cathode electrode 36 between which is formed a plasma 38 with a gas mixture supplied at inlet 40. The supplied mixture is a chemical etchant comprising a gas mixture comprising a carbon fluoride gas ($C_nF_{2n+2}$) and an inert gas, e.g., He, Ar or Xe. The gas mixture supplied into chamber 32 and expended in the etching process leaves chamber 32 via outlet 42. RF power to cathode electrode 36 is provide by power supply 44, e.g., having a frequency of 13.56 MHz. Cathode electrode 36 is water cooled by means of water supplied at supply system 46. Insulating means 48 is provided between grounded system housing 31 and power connection to cathode electrode 36.

A semiconductor or other type of wafer 50 is positioned in chamber 32 on cathode electrode 36 and a etching plasma 38 is created for etching the surface of wafer 50. The operating temperature of system 30 is generally within the range of 15° C.–100° C. As the operating temperature becomes higher, the chemical etching action correspondingly becomes higher. In utilizing system 30, important features of the process of this invention is the control of the selectivity of the gas mixture and selecting the proper gap width 52 between parallel anode electrode 34 and cathode electrode 36.

The following several examples illustrate the method of this invention without intending to limit the practice of the invention to the particular examples illustrated.

EXAMPLE 1

In a first example, argon gas was added in a reactive ion etching system, such as, a DryTek 384 system of the type shown in FIG. 3, employing hexafluoroethane gas ($C_2F_6$) mixed with the inert gas, Ar. FIG. 6 is a graphic illustration showing the relationship between etching rate and selection ratio for various types of silicon oxide layers, e.g., SOG, TEOS, and LTO layers, while varying the mixing or flow ratio of hexafluoroethane gas ($C_2F_6$) and Ar gas in the etching system. The etching rate is illustrated along the left side of the graph while the selectivity ratio is illustrated along the right side of the graph for SOG layer 11, TEOS layer 12 and LTO layer 13. These particular layers are intended as representative examples of particular types of silicon oxide layers, as the method of this invention may also be applied to other kinds of formed silicon oxide layers. The etching conditions applied relative to this example were a system pressure of 200 mTorr, a cathode temperature of 15° C., an applied RF power of 800 W, a total flow per unit volume of $C_2F_6$/Ar gas mixture of 150 sccm and an applied etching time of 10 seconds. The gap width 52 was 25.4 mm. As illustrated in FIG. 6, the curve characteristics for layers 11, 12 and 13 have the same feature but the etching rate for the SOG layer is characteristically greater than the etching rate for the TEOS and LTO layers. Even though the etching rate for the SOG film is reduced with an increase in the Ar gas in the mixing ratio, the etching rate for the SOG film is characteristically several hundreds of nm/min, e.g., 400 nm/min. to 1,000 nm/min greater than the TEOS and LTO films. This is more than ten times greater than the etching rate achievable from conventional sputter etching or ion milling employing AR gas.

In FIG. 4, the selectivity ratio for TEOS layer 14 and LTO layer 15 are also illustrated. It can be seen that the selectivity for TEOS layer 14 and LTO layer 15 are close to each other, falling within the range of 1.12–1.17. When the mixing ratio of $C_2F_6$/Ar is 50%, the selectivity for these films is respectively about 1.12 and 1.17. Such selectivity value is quite suitable for the planarization process and is by no means inferior to the selection ratio obtainable with respect to conventional planarization techniques employing Ar sputtering or ion milling, which is about 1.17 or 1.18.

The graphic illustration of FIG. 5 illustrates data relative to the etching rate and surface uniformity achieved relative to a $SiO_2$ layer formed by thermal oxidation while varying the applied RF power to system 30. The other conditions of system 30 were a pressure of 200 mTorr, an applied etching time of 17 seconds, and a flow mixture containing 15 sccm of hexafluoroethane gas ($C_2F_6$) and 135 sccm of Ar gas. The results as indicated by line 17 show that the etching rate increases with an increase in RF power. On the other hand, as indicated by line 16, uniformity of the etched surface gradually decreases with an increase in RF power. Thus, uniformity, i.e., variation of the amount of etching over various portions of the semiconductor wafer, is desirably reduced with a decrease in RF power, with corresponding reduction in the etching rate resulting in improved etching uniformity.

As a variation of the foregoing example, a sample, such as, that disclosed in FIG. 4 was employed comprising a $SiO_2$ layer 3, having a thickness of 600 nm, which was formed by thermal oxidation on vapor deposited aluminum wiring 2 formed on silicon substrate 1. Next, a SOG layer having a thickness of 70 nm, was deposited over $SiO_2$ layer 3 via a spin-on application. Next, an etch-back was performed in reactive ion etching system 30 for a period of about 18 seconds utilizing an RF power of 800 W and a $C_2F_6$/Ar gas mixture comprising 15 sccm of $C_2F_6$ and 135 sccm of Ar. The system pressure was about 200 mTorr. The etching rate is about 457 nm/min. The resultant etchback was to a depth of 150 nm and selectivity was about 1.1. The applied etching time to achieve planarization was reduced by about 10% compared to the case employing conventional sputter or ion milling etching methods. Further, since a non-impact, chemical type etching process is being utilized, adverse effects on layer quality and degradation in transistor characteristics, such as, threshold voltage, may be avoided. Also, since the product of the etching reaction is volatile, contamination caused by remaining physically removed particles does not occur and, as a result, resulting enhancement in production yields can be realized.

While the foregoing example involved etch-back of SOG/$SiO_2$ layers showing good selectivity, the etch-back of SOG/TEOS layers in some cases have not provided an improved level of selectivity in the use of the method of this invention, e.g., in some cases around 1.25, vis a vis of about 1.18 for conventional methods, but this selectivity level is still useful to obtain the desired degree of surface flatness, for example, surface uniformity, about 2%–6.3%, which is about ¼ to 1/10 improved over such conventional etching methods. Also, the etching rate is about 10 times faster than conventional methods.

EXAMPLE 2

The next example relates to the mixture of tetrafluoromethane gas ($CF_4$) and Ar as illustrated in FIG. 6. FIG. 6 is a graphic illustration of the relationship between etching rate and selectivity on silicon oxide layers while varying the mixing ratio between $CF_4$ and Ar in reactive ion etching system 30. The silicon oxide layers treated in this example were an SOG layer and a TEOS layer. The applied conditions in the etching system were substantially the same as in the case of Example 1, i.e., the data relative to etching rate and selectivity were obtained by varying the mixing ratio (flow ratio) of $CF_4$ and Ar gas under system conditions where the gas pressure was 200 mTorr, applied RF power was 800 W, the applied etching time was 10 seconds and a total flow volume of the gas mixture was 150 sccm per unit. The gap width 52 was 25.4 mm. As shown in FIG. 6, the etching rate relative to the SOG and TEOS layer was several hundreds nm/min, e.g., in the range of 400 nm/min to 1,000 nm/min, as respectively indicated by lines 18, 19. The etching rate was reduced within this range by increasing the amount of Ar in the mixing ratio of gases. Also, as illustrated by line 20, the selectivity for the TEOS layer was within the range of 1.12–1.16 and the selectivity with 50% mixing ratio is about 1.12.

EXAMPLE 3

The next example relates to the mixture of octafluoropropane gas ($C_3F_8$) and Ar as illustrated in FIG. 7. FIG. 7 is a graphic illustration of the relationship between etching rate and selectivity on silicon oxide layers while varying the mixing ratio between $C_3F_8$ and Ar in a reactive ion etching system. The silicon oxide layers treated in this example were an SOG layer and a TEOS layer. The applied conditions in the etching system were substantially the same as in the case of Example 1, i.e., the data relative to etching rate and selectivity were obtained by varying the mixing ratio (flow ratio) of $C_3F_8$ and Ar gas under system conditions where the gas pressure was 200 mTorr, applied RF power was 800 W, the applied etching time was 10 seconds and a total flow volume of the gas mixture was 150 sccm per unit. The gap width 52 was 25.4 mm. As shown in FIG. 7, the etching rate relative to the SOG and TEOS layer was several hundreds nm/min, e.g., in the range of 400 nm/min to 1,000 nm/min, as respectively indicated by lines 21, 22. The etching rate was reduced within this range by increasing the amount of Ar in the mixing ratio of gases. Also, as illustrated by line 23, the selectivity for the TEOS layer was within the range of 1.12–1.16 and the selectivity with 50% mixing ratio is about 1.12.

Thus, in the case of both Examples 2 and 3, the etching rate was at substantially the same level as in the case of employing a gas mixture comprising $C_2F_6$ and Ar gas with the etching rate being greater than ten times the etching rate of conventional Ar sputtering or ion milling etching. Further, the selectivity value was also at the same level as the selectivity level in the case of a $C_2F_6$/Ar gas mixture, which is not inferior to the selectivity of about 1.18 achieved in conventional Ar sputtering or ion milling etching.

EXAMPLE 4

The next example relates to the mixture of hexafluoroethane gas ($C_2F_6$) and He as illustrated in FIG. 8. FIG. 8 is a graphic illustration of the relationship between etching rate and selectivity on silicon oxide layers while varying the mixing ratio between $CF_4$ and Ar in reactive ion etching system 30. The silicon oxide layers treated in this example were an SOG layer and a TEOS layer. The applied conditions in the etching system were substantially the same as in the case of Example 1, i.e., the data relative to etching rate and selectivity were obtained by varying the mixing ratio (flow ratio) of $C_2F_6$ and He gas under system conditions where the gas pressure was 200 mTorr, applied RF power was 800 W, the applied etching time was 10 seconds and a total flow volume of the gas mixture was 150 sccm per unit. The gap width 52 was 25.4 mm. As shown in FIG. 10, the etching rate relative to the SOG and TEOS layer was several hundreds nm/min, e.g., in the range of 400 nm/min to 1,000 nm/min, as respectively indicated by lines 24, 25. The etching rate was reduced within this range by increasing the amount of He in the mixing ratio of gases. Also, as illustrated by line 26, the selectivity for the TEOS layer was within the range of 1.12–1.16 and the selectivity with 50% mixing ratio is about 1.12.

EXAMPLE 5

The next example relates to the mixture of hexafluoroethane gas ($C_2F_6$) and Xe as illustrated in FIG. 9. FIG. 9 is a graphic illustration of the relationship between etching rate and selectivity on silicon oxide layers while varying the mixing ratio between $CF_4$ and Ar in a reactive ion etching system. The silicon oxide layers treated in this example were an SOG layer and a TEOS layer. The applied conditions in the etching system were substantially the same as in the case of Example 1, i.e., the data relative to etching rate and selectivity were obtained by varying the mixing ratio (flow ratio) of $C_2F_6$ and Xe gas under system conditions where the gas pressure was 200 mTorr, applied RF power was 800 W, the applied etching time was 10 seconds and a total flow volume of the gas mixture was 150 sccm per unit. The gap width 52 was 25.4 mm. As shown in FIG. 9, the etching rate relative to the SOG and TEOS layer was several hundreds nm/min, e.g., in the range of 400 nm/min to 1,000 nm/min, as respectively indicated by lines 27, 28. The etching rate was reduced within this range by increasing the amount of Xe in the mixing ratio of gases. Also, as illustrated by line 29, the selectivity for the TEOS layer was within the range of 1.12–1.16 and the selectivity with 50% mixing ratio is about 1.12.

Thus, in the case of both Examples 4 and 5 wherein $C_2F_6$/He and $C_2F_6$/Xe were respectively employed, the etching rate was at substantially the same level as in the case of employing a gas mixture comprising $C_2F_6$ and Ar gas with the etching rate being greater than ten times the etching rate of conventional Ar sputtering or ion milling etching. Further, the selectivity value was also at the same level as the selectivity level in the case of $C_2F_6$/Ar gas mixture, which is not inferior to the selectivity of about 1.18 achieved in conventional Ar sputtering or ion milling etching.

Accordingly, when employing the method of dry chemical etching comprising this invention to perform an etch-back of one or more oxide layers for purpose of accomplishing planarization in the manner illustrated in FIG. 2, a significant decrease in etch-back time can be achieved wherein the rate and improved uniformity of the etch can be realized with a resultant increase in wafer throughput and yield over that previously obtainable with conventional physical and chemical etching methods. This improvement in selectivity is for gas mixture ratio of $C_nF_{2n+2}$/inert gas generally in a range between 10%/90% to 90%/10%. Further improvement in this range can be achieved with improved selectivity with attention paid to gap width 52 between anode electrode 34 and cathode electrode 36 of system 30. The percent optimum ratio of etching gas, $C_nF_{2n+2}$ to inert gas becomes increasing smaller as the gap width 53 becomes larger. Thus, a proper gap width 52 may provide a limitation in achieving optimum mixture ratio range for $C_nF_{2n+2}$/inert gas.

FIG. 10 illustrates the relationship between selectivity and the flow ratio in the case of a etching gas mixture comprising $C_2F_6$ and Ar for two cases wherein the electrode gap width 52 is respectively 15.7 mm (solid line) and 25.4 mm (dotted line). The selectivity in any case is greater than 1. FIG. 11 shows the relation between gap width 52, in millimeters, of electrodes 34 and 36 and the range of optimum flow ratio in per cent of $C_nF_{2n+2}$/Ar, e.g., $C_2F_6$/Ar %. Curve 54 represents the range of least selectivity while curves 56 and 58 represent the boundaries of optimum flow ratio for the range of illustrated gap widths 52. In other words, curve 54 shows the electrode gap width/flow rate relationship when the selectivity, i.e., the etching rate ratio of SOG/TEOS, is minimum, i.e., close to 1. Accordingly, when the etching is performed relative to the conditions for values of curve 54, the etch surface of the SOG/TEOS films can be substantially planarized. This selectivity remains substantially uniform at 1 even if there may be changes in gas flow rate or the electrode gap width. As an example in reference to FIGS. 10 and 11, in the case for an electrode gap width of 25.4 mm and a flow rate of $C_3F_8$ of 75 sccm, i.e., a ratio of $C_3F_8$/Ar of 50%, the selectivity is at a minimum value on curve 54 in FIG. 11. The selectivity does not significantly change even if the flow rate of $C_3F_8$/Ar having a minimum value of selectivity changes within a range of about 25% to about 65%. Curves 56 and 58 show the approximate boundary conditions of this margin width.

From FIGS. 10 and 11, Table I below illustrates the range of optimum flow ratio, i.e., the range which includes the minimum selectivity, i.e., a selectivity close to 1 for achieving planarization relative to variance in electrode gap width. In Table I, "less than" may be a minimum value of about 5 mm and "more than" may be a maximum value within the range of 200 mm to 300 mm. Anything greater results in the inability to establish a plasma. The results relative to Table I were achieved in connection with a gas mixture comprising $C_2F_6$ and Ar gas. The pressure in system 30 was 200 mTorr, cathode temperature was 15° C. and RF power was 800 W. The optimum flow ratio relative to FIG. 5 is a range which includes sufficiently low selectivity to achieve good planarization.

TABLE I

| Electrode Gap Width | Optimum Mixture Ratio ($C_nF_{2n+2}$/Ar) |
|---|---|
| Equal to or less than | |
| 15.0 mm | 2-20% |
| 15.7 mm | 5-25% |
| 25.4 mm | 25-65% |
| 45.0 mm | 60-95% |
| Equal to or more than | |
| 50.0 mm | 70-95% |

When the amount of Ar in the etching gas mixture is more than about 98%, etching progresses is very slow. When the amount of $C_nF_{2n+2}$ in the etching gas mixture is more than about 95%, selectivity increases abruptly making it difficult to control the etching process. It can be seen from the foregoing relation that the smaller the gap width 52 between electrodes 34 and 36, the smaller the percentage concentration of etching gas in the inert gas. The larger the gap width 52 between electrodes 34 and 36, the larger the percentage concentration of etching gas in the inert gas in order to increase the availability of fluorine radicals, F*.

While the by-product of the chemical etching reaction is volatile, the chamber does become contaminated over time with the by-product, e.g., polymer material, which may be removed from the chamber walls and electrodes of reactive ion system 30 by means of a dry cleaning process utilizing an $O_2$ plasma. The preferred conditions for such a cleaning process is an RF power of about 800 watts, a flow rate of $O_2$ of about 200 sccm, and a system pressure of 3,000 mTorr. Employing these parameters, the system chamber may be cleaned of all polymer material in about 2 minutes.

Reference is now made to the utilization of the method with reference to the selective use of different selectivity ratios to achieve optimum planarization.

FIGS. 12A and 12B illustrate the case when the selectivity ratio is greater than 1. In FIG. 12A, a pattern of aluminum wiring or conductors 2 are formed in a conventional manner, e.g., vapor deposition and selective etching, on the surface of silicon substrate 1. This is followed by the formation of $SiO_2$ layer 3 (TEOS or LTO), forming a first silicon oxide layer, which may be formed by CVD or thermal oxidation over aluminum wiring 2. Next, SOG (spin-on glass) layer 4 is applied by a conventional spinner, comprising a second silicon oxide layer, onto $SiO_2$ layer 3. The etching process performed is that previously illustrated relative to FIG. 4 and Example 1. The etching rate of the SOG film is faster and selectivity of either film is greater than one. FIG. 12B shows the results upon etchback when the selectivity ratio is greater than 1. Since the etching of SOG film 4 progresses at a faster rate compared to either an LTO or TEOS film 3, as indicated in FIG. 12B, indentations 4' are left at the etching surface so that planarization is more difficult to achieve.

FIGS. 12C and 12D illustrate the case when the selectivity ratio is less than 1. In FIG. 12C, a pattern of aluminum wiring or conductors 2 are formed in a conventional manner, e.g., vapor deposition and selective etching, on the surface of silicon substrate 1. This is followed by the formation of $SiO_2$ layer 3 (TEOS or LTO), forming a first silicon oxide layer, which may be formed by CVD or thermal oxidation over aluminum wiring 2. Next, SOG (spin-on glass) layer 4 is applied by a conventional spinner, comprising a second silicon oxide layer, onto $SiO_2$ layer 3. FIG. 12D shows the results upon etchback when the selectivity ratio is less than 1. In this case, the etching gas mixture, for example, may be comprised of $CHF_3$ and $CF_4$. Since the etching of SOG film 4 using this gas mixture progresses at a slower rate compared to either an LTO or TEOS film 3, upon exposure through etching of the LTO or TEOS film 3, SOG film 4 functions like a mask forming a pattern shown in FIG. 11D wherein the surface of a remaining portion 4" of SOG film 4 is above the etched surface of film 3.

A method according to the present invention takes advantage of these two separate phenomena with the provision of a process wherein a first etchback step is applied to the structure having a selectivity ratio greater than 1, followed by a second etchback step applied to the structure having a selectivity ratio less than 1 upon initial exposure of the LTO or TEOS film 3 through application of the first etchback step. This two step process is illustrated in FIGS. 13A-13C. In FIG. 13A, a pattern of aluminum wiring or conductors 2 are formed in a conventional manner, e.g., vapor deposition and selective etching, on the surface of silicon substrate 1. This is followed by the formation of $SiO_2$ layer 3 (TEOS or LTO), forming a first silicon oxide layer, which may be formed by CVD or thermal oxidation over aluminum wiring 2. Next, SOG (spin-on glass) layer 4 is applied by a conventional spinner, comprising a second silicon oxide layer, onto $SiO_2$ layer 3. Next, a first etching step takes place utilizing an etching gas flow having a selectivity greater than 1, e.g., comprising $C_2F_6$/Ar gas mixture illustrated in FIG. 1. As shown in FIG. 13B, the etchback is continued until a major portion of the surface of oxide film 3 has been exposed. This end point detection is typically accomplished with the use of emission spectrography. Due to the comparatively faster rate of etching of SOG film 4, an indentation 4' is formed, as in the case of FIG. 12B. At this juncture, a second etching step commences utilizing an etching gas flow having a selectivity less than 1, e.g., comprising $CHF_3/CF_4$ gas mixture. FIG. 13C shows the results upon etchback when the selectivity ratio is less than 1 wherein by monitoring the progress of etching, the etching step can be terminated when the etch level of film 3 substantially matches the level of the remaining portion 4A of film 4. In this connection, substantial matching is within 5% difference between the respective heights of layers 3 and 4 relative to substrate 1.

In connection with etching of SOG layer 4, overetching is limited to within the range of 0% to 20% of the thickness of the film, and more preferably within the range of 5% to 15% of the thickness of the film. The same is true relative to etching of TEOS layer 3 wherein over-etching is limited to within the range of 0% to 20% of the thickness of the film, and more preferably within the range of 5% to 15% of the thickness of the film. The reason for this is that since etching uniformity is about 5%, it is necessary to provide over-etching of about 5%. However, if etching is extended beyond 20%, the etched surface will not be uniform because of extended etching into indentation 4'. Therefore, over-etching should not be extended beyond about 20% of the film thickness.

EXAMPLE 6

As an example of the application of this invention, active ion etching is employed relative to the structure shown in FIG. 14 using system 30 shown in FIG. 3. FIG. 14 illustrates a typical semiconductor wafer in processing comprising the first metal layer and first and second oxide layers. A pattern of aluminum wiring or conductors 2 are formed in a conventional manner, e.g., vapor deposition and selective etching, on the surface of silicon substrate 1. This is followed by the deposition of $SiO_2$ layer 3, comprising a first silicon oxide layer, which may be formed by CVD method or thermal oxidation over aluminum wiring 2, e.g., a TEOS film. Next, SOG (spin-on glass) layer 4 is applied by a conventional spinner, comprising a second silicon oxide layer, onto $SiO_2$ layer 3. As illustrated in FIG. 14, the surface has an irregularity caused by the original formation of Al wiring 2. In order to achieve a highly planarized surface, layers 3 and 4 are etched back to a level indicated by dotted line 5 using system 30 shown in FIG. 3. In a first etchback step, an etching gas mixture of $C_2F_6$ and Ar is employed in the manner illustrated in FIG. 4 as per Example 1. In system 30, the pressure was 200 mTorr; etching time was 20 seconds; the $C_2F_6$ flow rate was 15 sccm; the Ar flow rate was 135 sccm; the RF power was 800 W; and the cathode electrode temperature was maintained at 15° C. The gap width was 25.4 mm. These conditions provide an etching rate for TEOS film 3 of 4200 Å/min. and an etching rate for SOG film 4 of 5000 Å/min. As a result, the difference between the TEOS film and the SOG film height at the etched back surface, such as shown at 4' in FIG. 12B, is approximately 150 Å.

Next, a second etchback step is conducted employing reactive ion etching system 30 utilizing an etching gas mixture of $CHF_3$ and $CF_4$ which is utilized to smooth out this 150 Å difference. In system 30, the pressure was 240 mTorr; the etching time was 15 seconds; the $CHF_3$ flow rate was 140 sccm; the $CF_4$ flow rate was 60 sccm; the RF power was 300 W; and the cathode electrode temperature, 15° C. These conditions provided an etching rate for the TEOS film of 3000 Å/min. and an etching rate for the SOG film of 2400 Å/min. Following this treatment, the etched back surface is substantially planarized by this two step method. In this reactive ion etching step, the mixture ratio of $CHF_3/CF_4$ may be in the range from about 123/73 sccm to about 190/10 sccm, as shown in FIG. 15, wherein the selectivity is less than 1.

Relative to the second etchback step, an etching gas mixture of ($CF_4+SF_6$) may be employed instead of ($CHF_3+CF_4$).

Relative to FIG. 15, it should be noted that the selectivity of the $CHF_3+CF_4$ gas mixture can be varied to provide, first, a selectivity greater than 1 to achieve faster etching of SOG during the first etchback step of the two step etchback method followed by a change in the gas mixture ratio to provide, second, a selectivity less than 1 to achieve faster etching of TEOS during the second etchback step of the two step etchback method. An example from FIG. 15 of a gas mixture ratio for the first etchback step is 100 sccm for $CHF_3$ and 100 sccm for $CF_4$. An example of a gas mixture ratio for the second etchback step is 150 sccm for $CHF_3$ and 50 sccm for $CF_4$. The change in gas flow is accomplished under computer control. Thus a single gas mixture can accomplish the two step etchback method set forth herein. The only drawback may be maintaining consistency of the etching rate for SOG since the curve in FIG. 15 is so steep. However, this can be improved by operating in the upper region of the curve for SOG.

In another aspect of the method of this invention, it is preferred that the TEOS or LTO film 3 be exposed by etching more than the thickness of the overlying SOG film 4. There are two reasons in support of this preference. First, if SOG film 4 is not etched down to the surface of TEOS film 3, as illustrated in FIG. 16A, there remains an Al/SOG interface 4B upon deposition of an Al interconnect 6 on the remaining portion of the SOG film 4. Al corrosion and electro-migration occurs at interface 4B due to a potential that may exist between Al electrode 2 and Al interconnect 6. However, if the etchback method is carried out until TEOS film 3 is substantially exposed, as illustrated in FIG. 16B, this corrosion effect is substantially eliminated or is less likely to occur.

Second, if SOG film 4 is not etched down to the surface of TEOS film 3, as illustrated in FIG. 17A, and, thereafter, a photoresist 7 is formed over SOG film 4 with a pattern for forming contact holes 8 in films 3, 4 to expose a surface of wiring 2 for forming a connection, enhanced side etching will occur in the SOG film 4, as illustrated in FIG. 17B, upon subsequent etching to form contact hole 9. Such etching is conventionally carried out using wet etching. However, if the etchback method is carried out until TEOS film 3 is substantially exposed, as illustrated in FIG. 18A, and, thereafter, a photoresist 7 is formed over SOG film 4 with a pattern for forming contact holes 8 in films 3, 4 to expose a surface of wiring 2 for forming a connection, enhanced side etching will not occur, as shown in FIG. 18B, upon subsequent etching to form contact hole 9 due to the absence of SOG film 4.

While the invention has been described in conjunction with several specific embodiments, it is evident to those skilled in the art that many further alternatives, modifications and variations will be apparent in light of the foregoing description. For example, a similar effect may be achieved when the method of this invention is employed with other kinds of silicon oxide layers or to other types of wafers, such as insulating wafers, or when the method of this invention is employed with other kinds of fluoride gases or inert gases or employed with different combinations of one or more fluoride gases mixed with one or more different inert gases. Further, beside the employment of this invention to the planarization of a multilayer interconnection semiconductor structure, the method of this invention may also be applied to a trench etching process with a low selectivity, such as in the case of groove filling procedure of a trench wherein two or more types of silicon oxide layers are involved in the procedure. Thus, the invention described herein is intended to embrace all such alternatives, modifications, applications and variations as may fall within the spirit and scope of the appended claims.

What is claimed is:

1. A method of producing a semiconductor device including a step for simultaneously dry etching a deposited silicon oxide layer comprising the steps of:
   providing an etching gas mixture comprising a carbon fluoride gas, $C_nF_{2n+2}$, wherein n is an integer, and an inert gas;
   creating a plasma wherein fluorine radicals, $F^*$, are liberated in the plasma;
   providing an absorption layer comprising inert gas molecules on an etching surface of said silicon oxide layer; and
   applying the fluorine radicals, $F^*$, to the etching surface of said silicon oxide layer;
   wherein the formed absorption layer on the etching surface provides a buffering effect on the application of the fluorine radicals, $F^*$, to the etching surface thereby permitting enhancement of the etching rate while maintaining controlled etching uniformity.

2. The method of claim 1 wherein said inert gas present in the etching gas mixture is at least 10% by volume.

3. The method of claim 2 wherein said inert gas comprises one or more gases selected from the group consisting of He, Ar and Xe.

4. A method of producing a semiconductor device employing an etch-back planarization step comprising the steps of:
   applying a first oxide layer over a patterned metal layer;
   applying a second SOG layer over said first layer;
   utilizing an etching gas mixture comprising a carbon fluoride gas, $C_nF_{2n+2}$, wherein n is an integer, and an inert gas;
   creating a plasma wherein fluorine radicals, $F^*$, are liberated in the plasma;
   providing an absorption layer comprising inert gas molecules on an etching surface of said first and second layers; and
   applying the fluorine radicals, $F^*$, to the etching surface of said first and second layers to a predetermined depth to form a more planarized surface;
   wherein the formed absorption layer on the etching surface provides a buffering effect on the application of the fluorine radicals, $F^*$, to the etching surface thereby permitting enhancement of the etching rate while maintaining controlled etching uniformity.

5. The method of claim 4 wherein said inert gas present in the etching gas mixture is at least 10% by volume.

6. The method of claim 5 wherein said inert gas comprises one or more gases selected from the group consisting of Ar, He and Xe and the first oxide layer comprises LTO or TEOS.

7. A method of producing a semiconductor device including the planarization of an exposed surface of the semiconductor wafer during the practice of the method comprising the steps of:
   providing reactive ion etching system employing a gas medium comprising a mixture of a carbon fluoride gas, $C_nF_{2n+2}$, wherein n is an integer, and an inert gas, said gas mixture comprising a gas mixture ratio of carbon fluoride gas/inert gas in the range between about 2%/98% to 95%/5%;
   placing the semiconductor wafer in a plasma generated by the system including a high volume of fluorine radicals, $F^*$;
   providing an absorption layer comprising inert gas molecules on a surface of the semiconductor wafer; and
   etching the surface of the semiconductor wafer with the application of the fluorine radicals, $F^*$, to the surface;
   wherein the formed absorption layer on the etching surface provides a buffering effect on the application of the fluorine radicals, $F^*$, to the etching surface thereby permitting enhancement of the etching rate while maintaining controlled etching uniformity.

8. The method of claim 7 wherein said gas medium is selected from the group consisting of $CF_4$, $C_2F_6$, $C_3F_8$, Ar, He and Xe.

9. The method of claim 8 wherein the etching rate is in the range of 400 nm/min. to 1,000 nm/min. and selectivity is in the range of 1.12–1.17.

10. The method of claim 7 including the step of cleaning the reactive ion etching system of contaminants by employing an $O_2$ plasma for a period of at least 2 minutes.

11. A method of producing a semiconductor device including the planarization of an exposed surface of a semiconductor wafer during the practice of the method comprising the steps of:
   providing a reactive ion etching system having an anode electrode and a cathode electrode in spatial, parallel relation and having a predetermined gap width therebetween;
   employing a gas medium comprising a mixture of a carbon fluoride gas, $C_nF_{2n+2}$, wherein n is an integer, and an inert gas, said gas mixture comprising a gas mixture ratio of carbon fluoride gas/inert gas in the range from about 2%–20% to about 70%–95% with a corresponding gap width in the range from about 15 mm to about 50 mm;

placing the semiconductor wafer between said electrodes and in a plasma generated by the system producing a high volume of fluorine radicals, $F^*$; and etching the exposed surface of the semiconductor wafer with the application of the fluorine radicals, $F^*$, to the surface;

wherein the volume of inert gas in the carbon fluoride gas, $C_nF_{2n+2}$, for a given electrode gap width creates a buffering effect on the application of the fluorine radicals, $F^*$, to the etching surface enhancing the etching rate while maintaining etching uniformity.

12. A method of planarizing two sequentially deposited first and second oxide layers wherein said layers are of different oxide materials and have different etching rate characteristics, comprising the steps of:

initially etching said second layer with an etching medium that etches said second oxide at a faster rate compared to said first oxide until a substantial portion of said first oxide layer is exposed; and thereafter etching said first layer with an etching medium that etches said second oxide at a faster rate compared to said first oxide until the surfaces of said second oxide layer and remaining portion of said first oxide layer are substantially co-planar.

13. A method of producing a semiconductor device including the planarization of an exposed surface of a semiconductor wafer during the practice of the method comprising the steps of:

sequentially depositing first and second oxide layers on a support surface of the wafer, said oxide layers of different oxide type wherein said second layer has a selectivity greater than one and said first layer has a selectivity less than 1;

providing reactive ion etching system using an etching medium comprising a carbon fluoride gas, $C_nF_{2n+2}$, wherein n is an integer; and etching said second oxide layer with an etching medium having a selectivity greater than one so as to etch said second oxide layer at a rate faster than said first oxide layer until exposure of a substantial portion of said first oxide layer; and etching said first oxide layer with an etching medium having a selectivity less than one so as to etch said first oxide layer at a rate faster than said second oxide layer until the surfaces of the first and second oxide layers are substantially co-planar.

14. The method of claim 13 wherein the etching medium for said selectivity greater than one comprises a gas mixture of a carbon fluoride gas, $C_nF_{2n+2}$, and an inert gas, and the etching medium for said selectivity less than one comprises a gas mixture of a hydro-carbon fluoride gas, $C_nH_nF_{2n+1}$, and a carbon fluoride gas, $C_nF_{2n+2}$.

15. The method of claim 14 wherein the etching medium for said selectivity greater than one comprises a gas mixture of a $C_2F_6$ and Ar and the etching medium for said selectivity less than one comprises a gas mixture of a $CHF_3$ and $CF_4$.

16. The method of claim 15 wherein the mixing ratio of $C_2F_6/Ar$ is in the range of 135/15 sccm to 15/135 sccm and the mixing ratio of $CHF_3/CF_4$ is in the range of 123/73 sccm to 190/10 sccm.

17. A method of producing a semiconductor device including the planarization of an exposed surface of a semiconductor wafer during the practice of the method comprising the steps of:

providing a reactive ion etching system employing a gas medium comprising a carbon fluoride gas, $C_nF_{2n+2}$, wherein n is an integer, and an inert gas and wherein the applied RF power is in the range of 400 W to 800 W, the gas flow rate is in the range of 1:100 to 30:1, the total gas flow is in the range of 100 sccm to 200 sccm and the system pressure is in the range of 200 mTorr to 300 mTorr producing a plasma having a high volume of fluorine radicals, $F^*$;

placing the semiconductor wafer in a plasma generated by the reactive ion etching system including a high volume of fluorine radicals, $F^*$;

providing an absorption layer comprising inert gas molecules on a surface of the semiconductor wafer; and etching the surface of the semiconductor wafer by the application of the fluorine radicals, $F^*$, to the surface;

wherein the formed absorption layer on the etching surface provides a buffering effect on the application of the fluorine radicals, $F^*$, to the etching surface thereby permitting enhancement of the etching rate while maintaining controlled etching uniformity.

18. The method of claim 17 wherein said gas medium is selected from the group consisting of $CF_4$, $C_2F_6$, $C_3F_8$, Ar, He and Xe.

19. The method of claim 17 wherein the etching rate is in the range of 400 nm/min. to 1,000 nm/min. and selectivity is in the range of 1.12–1.16.

* * * * *